United States Patent [19]

Gwozdz

[11] Patent Number: 4,714,520

[45] Date of Patent: Dec. 22, 1987

[54] METHOD FOR FILLING A TRENCH IN AN INTEGRATED CIRCUIT STRUCTURE WITHOUT PRODUCING VOIDS

[75] Inventor: Peter S. Gwozdz, Cupertino, Calif.

[73] Assignee: Advanced Micro Devices, Inc., Sunnyvale, Calif.

[21] Appl. No.: 759,621

[22] Filed: Jul. 25, 1985

[51] Int. Cl.⁴ .................. B23P 15/00; B44C 1/22; B05D 5/12

[52] U.S. Cl. .................. 437/228; 156/651; 437/233

[58] Field of Search .............. 156/643, 644, 651, 648, 156/646; 427/85-87, 93, 96, 97

[56] References Cited

U.S. PATENT DOCUMENTS

| | | | |
|---|---|---|---|
| 4,104,086 | 8/1978 | Bondur et al. | 156/648 |
| 4,472,240 | 9/1984 | Kameyama | 156/651 |
| 4,481,070 | 11/1984 | Thomas et al. | 156/651 |
| 4,526,631 | 7/1985 | Silvestri et al. | 156/643 |
| 4,528,047 | 7/1985 | Bexer et al. | 156/643 |
| 4,533,430 | 8/1985 | Bower | 156/646 |
| 4,544,576 | 10/1985 | Chu et al. | 156/643 |
| 4,554,728 | 11/1985 | Shepard | 156/643 |
| 4,626,317 | 12/1986 | Bonn | 156/643 |

Primary Examiner—S. Leon Bashore
Assistant Examiner—Michael K. Boyer
Attorney, Agent, or Firm—Patrick T. King; John P. Taylor; J. Vincent Tortolano

[57] ABSTRACT

A process is disclosed for filling a trench in an integrated circuit structure without forming a void in the trench which, in a preferred embodiment, comprises partially filling the trench with an etchable material, etching the material in the trench with an etchant capable of removing material adjacent the top of the trench at a rate faster than the rate of removal adjacent the bottom of the trench, and then filling the remainder of the trench with the material; whereby the material deposited adjacent the top of the trench will not close off the trench prior to complete filling of the bottom of the trench with the material.

18 Claims, 4 Drawing Figures

METHOD FOR FILLING A TRENCH IN AN INTEGRATED CIRCUIT STRUCTURE WITHOUT PRODUCING VOIDS

BACKGROUND OF THE INVENTION

1. Field of the Invention

This invention relates to trenches formed in integrated circuit structures. More particularly, this invention relates to an improved method for filling such trenches without forming voids.

2. Description of the Prior Art

Trenches or slots are sometimes formed in integrated circuit structures, for example, to provide isolation of devices or circuits in the structure from adjoining devices or circuits. Such an isolation technique is described, for example, in Bondur et al U.S. Pat. No. 4,104,086. Customarily, the trench is either filled or lined with a dielectric material. When an isolation trench is cut in a silicon substrate, the trench is usually filled with oxide, nitride, or polysilicon or combinations of same usually covered with oxide to provide the desired isolation or insulation.

However, when the depth of the trench exceeds the width, as is often the case as the density of the integrated circuit structures continues to rise, voids in the filler material may occur as the filler material deposits on the sidewalls of the trench faster than the trench is filled from the bottom. This can result in premature closing off of the trench before complete filling. This may be due, in some cases, to initial formation of a reentrant trench with walls which flare or taper out at the bottom of the trench. In other instances, the void occurs due to a "necking in" of the deposited filler material adjacent the top of the trench as the material deposits on the sidewall of the trench. Even when a void does not occur, a microcrack or discontinuity may be created where the deposited filler material on the opposing sidewalls of the trench finally touch when the width of the trench is less than twice the depth of the trench since the thickness of the deposited material can grow twice as fast in the width dimension of the trench than the height (due to simultaneous deposition on opposing sidewalls).

In any event, the occurrence of voids or discontinuities can result in the formation of damaging stress conditions if oxidizing conditions penetrate the void or discontinuity.

The use of multistep techniques to prevent or alleviate the effects of voids in materials used for planarization is known. Thomas et al U.S. Pat. No. 4,481,070, assigned to the assignee of this invention, describes and claims such a technique for mitigating the effects of such voids formed in silicon dioxide between closely spaced metal lines when growing silicon dioxide to planarize an integrated circuit structure.

Bonn U.S. patent application Ser. No. 719,185, now U.S. Pat. No. 4,626,317 filed Apr. 3, 1985, and assigned to the assignee of this invention, describes and claims a multistep technique to inhibit or prevent the formation of voids or discontinuities from being formed in polysilicon being deposited in a trench or slot for planarization purposes. The process comprises first depositing polysilicon into a trench and then etching back a sufficient amount of the polysilicon to remove any voids or dislocations formed during the first deposit. The etchant removes more polysilicon from the sidewalls than the bottom of the trench due to simultaneous removal of as much polysilicon from each of the opposite sides of the trench as is removed from the bottom. Another layer of polysilicon is then deposited into the trench.

It would, however, be desirable to have a process wherein the removal of deposited material from the sidewalls of a trench could be graduated to remove more material from adjacent the top of the sidewall than adjacent the bottom when either the sidewalls are not parallel, as in a reentrant trench, or when the previously described "necking in" effect is occurring adjacent the top of the trench.

SUMMARY OF THE INVENTION

It is, therefore, an object of this invention to provide a method for filling a trench in an integrated circuit structure which will inhibit or prevent the production of voids or discontinuities in the filler material.

It is another object of this invention to provide a method for filling a trench in an integrate circuit structure which will inhibit or prevent the production of voids or discontinuities in the filler material wherein materail, initially deposited in a trench, is partially removed at a rate which is proportionally higher adjacent the top of the trench.

It is yet another object of this invention to provide a method for filling a trench in an integrated circuit structure which will inhibit or prevent the production of voids or discontinuities in the filler material wherein material, initially deposited in a trench, is partially removed by an etchant which is proportionally more effective adjacent the top of the trench.

It is a further object of this invention to provide a method for filling a trench in an integrated circuit structure which will inhibit or prevent the production of voids or discontinuities in the filler material wherein material, initially deposited in a trench in a low pressure vapor deposition process which permits penetration of the vapors to the bottom of the trench, is partially removed by a vaporous etchant at a higher pressure which does not penetrate into the trench as easily to therefore proportionally remove more material adjacent the top of the trench.

It is yet a further object of this invention to provide a method for filling a trench in an integrated circuit structure which will inhibit or prevent the production of voids or discontinuities in the filler material wherein material, in vapor form, is deposited in a trench in a low pressure vapor deposition process which permits penetration of the vapors to the bottom of the trench, and a vaporous etchant is also present in said vapor at a concentration sufficient to remove some of the material as it is deposited to therefore proportionally remove more material adjacent the top of the trench.

These and other objects of the invention will be apparent from the following description and accompanying drawings.

In accordance with one embodiment of the invention, a process for filling a trench in an integrated circuit structure without forming a void in the trench comprises partially filling the trench with an etchable material, etching the material in the trench with an etchant capable of removing material adjacent the top of the trench at a rate faster than the rate of removal adjacent the bottom of the trench, and then filling the remainder of the trench with the material; whereby the material deposited adjacent the top of the trench will not close off the trench prior to complete filling of the bottom of the trench with the material.

DESCRIPTION OF THE PREFERRED EMBODIMENTS

Figure 1:
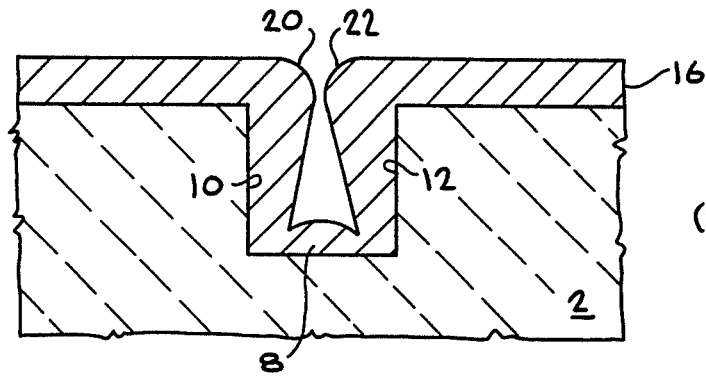
FIG. 1 is a vertical cross-sectional view of a prior art filled trench structure.

FIG. 1 illustrates the problems encountered in the prior art during the filling of a trench 8 in an integrated circuit structure 2. Trench 8 is a reentrant trench with sidewalls 10 and 12 which slope inwardly toward the top of the trench. Thus, for complete filling of trench 8 with material 16, it is necessary that more material be deposited at the bottom of the trench than at the top. However, it can be seen that just the opposite effect is occurring from that desired as the filler material deposits more heavily on the sidewalls adjacent the top of trench 8 as shown at 20 and 22. When deposits 20 and 22 finally touch, the entry of further material into trench 8 will be blocked and a void or open space will be trapped in the trench.

While such a void space may be initially sealed off by filler material 16, subsequent removal of some of the filler material from over the top of the trench, e.g., during a subsequent planarization step, may open the space sufficiently to allow penetration of other materials into the void such as dopants or oxides. Oxide growth in a confined area such as a void in a trench can set up undesirable stresses in the integrated circuit structure due to the enlarged volume of such an oxide compared to the material from which it is grown.

Figure 2:
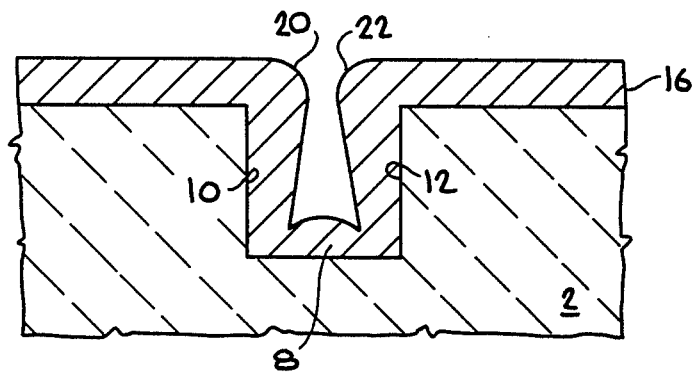
FIG. 2 is a vertical cross-sectional view of a trench after the initial filling in accordance with the invention.

In FIG. 2 the same trench is illustrated with a first deposit of filler material 16 in accordance with a preferred embodiment of the method of the invention. Preferably the initial deposit of filler material 16 will fill from about 30 to 50% of the depth of trench 8, most preferably about 40% of the depth of the trench.

Figure 3:
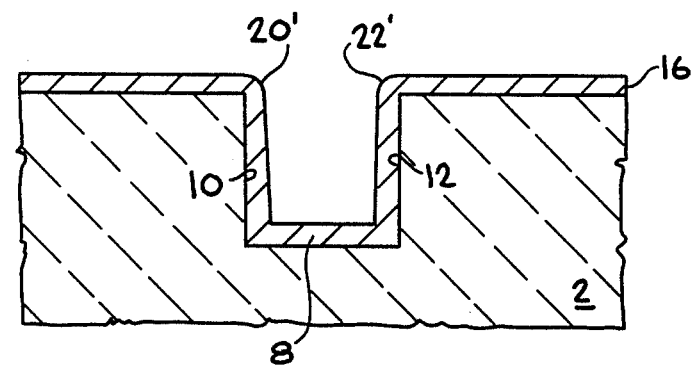
FIG. 3 is a vertical cross-sectional view of the trench of FIG. 3 after partial removal of the filler material by preferential etching in accordance with the method of the invention.

The deposition is then interrupted and a portion of filler material 16 is removed, as shown in FIG. 3, using preferential means such as an etchant which will remove more of the filler material adjacent the top of trench 8 as shown at 20' and 22' than adjacent the bottom. The etchant is applied for a sufficient period of time to remove about 50 to 80% of the depth or thickness of the initially deposited material as measured from the bottom of the trench. This, in turn results in removal of a sufficient amount of filler material 16 from sidewalls 10 and 12 to permit further deposition of filler material into the bottom of trench 8 without closing off the neck or top of trench 8.

Figure 4:
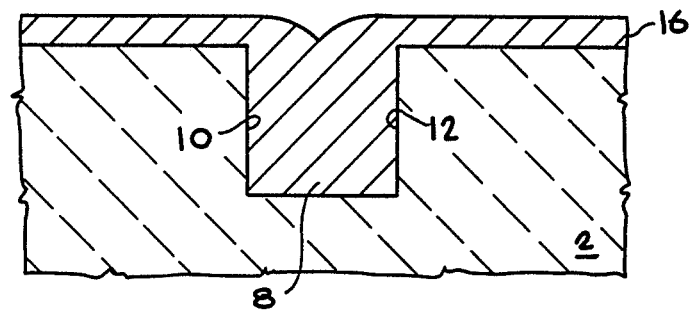
FIG. 4 is a vertical cross-sectional view of the trench of FIGS. 2 and 3 after refilling in accordance with the method of the invention.

Further filler material 16 is then deposited in the trench to complete the filling of the trench without forming any voids or discontinuities in the filler material as shown in FIG. 4.

If warranted because of the depth of the trench, with respect to its width, the process may be repeated, by only partially refilling the trench after the initial etching and then again removing a portion of the redeposited filler material and refilling the trench. These steps may then be repeated as often as is needed until the trench is completely filled without any voids.

Preferential etching of the sidewalls adjacent the top of the trench can be accomplished, in one embodiment of the invention, by using differing pressures for the respective vapor deposition of filler material and removal of the material by etching.

In all chemical vapor deposition (CVD) processes, the rate of diffusion is very important. In fact, most practical CVD depositions are limited by diffusion. The vapor of the material, e.g., the filler material, must diffuse from its source to the substrate and then, in a process for filling a trench, the vapors must diffuse into the trench. Likewise, any reaction products must diffuse away. The reason that low pressure CVD (LPCVD) is popular in the production of integrated circuit structures is because diffusion is enhanced at low pressures. For example, polysilicon and nitride CVD at atmospheric pressure are so limited by diffusion that the vapors do not diffuse well between wafers stacked in parallel in an atmospheric pressure CVD apparatus. CVD must be performed with wafers flat on a susceptor or supporting surface.

Low pressure chemical vappor deposition (LPCVD), on the other hand, enables depositions to be done in furnaces with closely packed wafers due to the better diffusion at such lower pressures, e.g., 50 to 200 mTorr.

Vapo etching is also limited by diffusion. Etch rates are reduced when diffusion is restricted both because of the ability of the etchant to reach the surface to be etched as well as removal of the etch products.

In accordance with a preferred embodiment of the invention, the deposition of filler material, such as polysilicon, is carried out under low pressure chemical vapor deposition (LPCVD) conditions which will provide as uniform as possible a deposit of the filler material throughout the trench. When polysilicon is to be deposited, the deposition is carried out at a temperature of from about 600° to 800° C., preferably about 700° C. at a pressure of from about 50 to 200 mTorr, preferably about 100 mTorr, for example by the pyrolysis of a silicon-containing gas, such as $SiH_4$.

The vapor etch may be carried out in the same CVD apparatus without removal of the wafers containing the integrated circuit structures, but at a higher pressure, e.g., a partial pressure of about 1 Torr, to restrict the diffusion of the vaporous etchant.

This results in the etchant vapors not as readily penetrating the trench. More effective etching and removal of filler material then occurs adjacent the top of the trench which is more easily reached by the etchant vapors.

The etch is preferably carried out at a temperature greater than 300° C., most preferably at a temperature of from greater than 300° up to about 900° or higher. Any vapor etchant capable of preferentially removing the filler material may be used. HCl vapors have been found to be an effective etchant for removing polysilicon filler material. The time period for the etch step will vary depending upon the amount of filler material to be removed which, in turn, will be dependent upon the dimensions of the trench.

In another embodiment of the invention, the trench may be filled using a CVD process in which both the filler material and the etchant are simultaneously presence in vaporous form but in differing concentrations to permit preferential deposition in the bottom of the trench due to the higher concentration of the filler material in the vapor. For example, a minor amount of HCl vapor, e.g., 10 to 20% by volume may be present in SiH4 gas during a LPCVD deposition. Alternatively, a mixture of silicon-containing gases or silanes may be used with some of the silanes containing halogens such as a mixture of predominantly SiH4 with a minor amount of SiHCl3, SiH2Cl2, or SiH3Cl or a mixture thereof.

Thus, the invention provides a novel method for filling a trench in an integrated circuit structure while preventing or inhibiting the formation of voids or discontinuities in the filler material by preferentially removing a portion of the filler material from adjacent the top of the trench after an initial deposit of filler material into the trench.

Having thus described the invention, what is claimed is:

1. A process for filling a trench in an integrated circuit structure without forming a void in said trench which comprises:
    (a) partially filling said trench with an etchable material;
    (b) etching said material in said trench with an etchant capable of preferentially removing material on the sidewall of said trench adjacent the top of said trench at a rate faster than the rate of removal of material on the sidewall of said trench adjacent the bottom of said trench; and
    (c) then filling the remainder of said trench with filler material; whereby said filler material subsequently deposited adjacent the top of said trench will not close off said trench prior to complete filling of the bottom of said trench with said filler material wherein said etchable material is deposited in said trench using a vapor deposition process; wherein said etching step comprises a vapor etch carried out at a temperature greater than 300° C. and a partial pressure of at least 1 Torr to provide a graduated etching of said sidewalls of said trench by said high partial pressure of said etchant, relative to the partial pressure of said deposition, which inhibits penetration of said etching into said trench.

2. The process of claim 1 wherein said vapor deposition process is carried out at a temperature of about 600° to 800° C. and a pressure of about 50 to 200 mTorr.

3. The process of claim 2 wherein said vapor deposition process is carried out for a time period sufficient to fill the trench to a level of about 30 to 50% of the depth of said trench.

4. The process of claim 3 wherein said filler material is polysilicon.

5. The process of claim 4 wherein said polysilicon is vapor deposited by pyrolysis of a silane.

6. The process of claim 4 wherein said polysilicon is vapor deposited by pyrolysis of SiH4.

7. The process of claim 1 wherein said etching step comprises etching said filler material for a time period sufficient to a depth which is from about 15 to 25% of the depth originally deposited in said trench.

8. The process of claim 1 wherein said etchant comprises a mineral acid vapor.

9. The process of claim 10 wherein said mineral acid vapor comprises HCl.

10. The process of claim 1 including the further steps of partially refilling said trench with said material after said etch step and then etching said material again.

11. The process of claim 1 wherein said steps of filling said trench with material and said etching step are carried out in a low pressure chemical vapor deposition apparatus without opening the apparatus between steps.

12. A method of filling a trench previously formed in an integrated circuit structure which comprises depositing a material in said trench and simultaneously removing a portion of said deposited material adjacent the top of said trench using etchant means capable of removing deposited material from the sidewalls of said trench at a rate which is proportionally higher adjacent the top of said trench to provide a graduated etch to prevent the creation of voids in said trench by material deposited adjacent the top of said trench closing off said trench prior to complete filling of the bottom of said trench with material wherein said simultaneous deposition and partial removal of said material is carried out by a vapor deposition process and wherein the ratios of the concentrations of vapors of said material being deposited and a gaseous etchant are adjusted to provide a faster rate of deposition than the etchant rate 13. The process of claim 12 wherein said filler material is produced from SiH4 vapors and said etchant comprises HCl vapors mixed with said SiH4.

14. The process of claim 12 wherein said gaseous etchant is formed in situ by the decomposition of a reactant into filler material and an etchant.

15. The process of claim 14 wherein said reactant comprises a mixture of SiH4 and more or more gases selected from the group consisting of SiHX3, SiH2X2, and SiH3X where X is a halogen.

16. A method for filling a trench in an integrated circuit structure while inhibiting the creation of voids in said trench caused by the deposition of polysilicon on the upper portions of the sidewalls of said trench at a faster rate than the deposition of said polysilicon on the sidewalls adjacent the bottom of said trench which comprises:
    (a) partially filling said trench with polysilicon to a depth of from 30 to 50% of the depth of said trench by vapor depositing a pyrolysis product of SiH4 at a temperature of from about 650° to 750° C. and a pressure of from about 50 to 200 mTorr;
    (b) selectively etching said polysilicon deposited on said upper portions of said sidewalls of said trench with HCl vapors at a temperature greater than 300° C. and a partial pressure of at least 1 Torr to restrict diffusion of said gaseous etchant into said trench and thereby to remove on a graduated basis from about 50 to 80% of the polysilicon previously deposited thereon; and
    (c) filling said trench by further vapor deposition of said polysilicon;
    whereby pollysilicon deposited on said upper portions of said sidewalls of said trench will not close off said trench prior to complete filling of the bottom of said trench with said polysilicon due to said graduated removal of said polysilicon on the sidewalls of said trench.

17. The process of claim 16 including repeating said filling and etching steps until said trench is filled.

18. A method for filling a trench in an integrated circuit structure while inhibiting the creation of voids in said trench caused by deposition of filler material on the upper portions of the sidewalls of said trench at a faster rate than the deposition on the sidewalls of said trench adjacent the bottom of said trench which comprises:

(a) partially filling said trench with polysilicon to a depth of from 30 to 50% of the depth of said trench by vapor deposition at a pressure of from about 50 to 200 mTorr;

(b) selectively etching said polysilicon in said trench at a partial pressure of at least 1 Torr to selectively remove said polysilicon deposited on the sidewalls of said trench at a rate which is proportionally higher adjacent the top of said trench because the vaporous etchant, at a pressure higher than said polysilicon deposition pressure, does not penetrate the trench as easily to thereby provide a graduated removal of polysilicon on said sidewall of said trench; and (c) filling said trench by further vapor deposition of said polysilicon;

whereby polysilicon initially deposited on said upper portions of said trench sidewalls will not close off said trench prior to complete filling of the bottom of said trench with said polysilicon and the formation of voids in said polysilicon will be inhibited.

* * * * *